United States Patent [19]

Phillips, Jr.

[11] Patent Number: 5,130,528
[45] Date of Patent: Jul. 14, 1992

[54] OPTO-PHOTO-ELECTRIC SWITCH

[75] Inventor: Alfred Phillips, Jr., Wappingers Falls, N.Y.

[73] Assignee: International Business Machines Corporation, Armonk, N.Y.

[21] Appl. No.: 662,689

[22] Filed: Mar. 1, 1991

[51] Int. Cl.$^5$ .............................................. G02F 1/03
[52] U.S. Cl. ................................ 250/213 A; 359/257
[58] Field of Search ............ 250/213 A, 213 R, 211 J; 324/96; 372/107; 359/257

[56] References Cited

U.S. PATENT DOCUMENTS

| | | | |
|---|---|---|---|
| 3,38,064 | 10/1977 | Powlus . | |
| 3,050,633 | 8/1962 | Loebhner et al. . | |
| 3,145,302 | 8/1964 | Dunne et al. . | |
| 3,157,792 | 1/1964 | Low et al. . | |
| 3,470,491 | 9/1969 | McNeille . | |
| 3,611,207 | 10/1971 | Klahr | 250/199 |
| 3,649,838 | 3/1972 | Phelan, Jr. | 250/213 R |
| 3,781,081 | 12/1973 | Rokos | 350/96 WG |
| 3,818,451 | 6/1974 | Coleman | 307/311 |
| 3,910,679 | 10/1975 | Rushworth et al. | 250/225 |
| 3,995,311 | 11/1976 | Taylor | 350/96 WG |
| 4,053,451 | 10/1977 | Harney | 250/206 |
| 4,128,300 | 12/1978 | Stotts et al. | 350/96.14 |
| 4,139,781 | 2/1979 | Fulkerson | 307/213 |
| 4,506,151 | 3/1985 | MacDonald et al. | 250/213 A |
| 4,555,785 | 11/1985 | Scifres et al. | 372/8 |
| 4,606,032 | 8/1986 | Scifres et al. | 392/38 |
| 4,675,518 | 6/1987 | Oimura et al. | 250/205 |
| 4,689,793 | 8/1987 | Liu et al. | 372/8 |
| 4,751,378 | 6/1988 | Hinton et al. | 250/213 A |
| 4,754,131 | 6/1988 | Bethea et al. | 250/211 J |
| 4,754,132 | 6/1988 | Hinton et al. | 250/213 A |
| 4,782,223 | 11/1988 | Suzuki | 250/214 R |
| 4,802,175 | 1/1989 | Suzuki | 372/8 |
| 4,967,068 | 10/1990 | Lentine et al. | 250/213 A |
| 4,978,842 | 12/1990 | Hinton et al. | 250/213 A |

OTHER PUBLICATIONS

The Electrooptic Effect Quantum Electronics 3rd Edition Amnon Yariv pp. 298–299 Chapter 14 The Modulation of Optical Radiation.
Integrated Optics; Theory and Technology, 2d Edition Springer–Verlag Chapter 8.2 The Electro–Optic Effect p. 123.
Lectures on Physics vol. 1, Feyman, Leighton, Sands, p. 33–2.
Unknown Source; Variable Retardation Plates and Compensators, Chapter 10 pp. 141–144.
Unknown Source; An optical bistable switch based on self-focusing in an artificial Kerr medium N.P. Walker, D. R. Drury & M. A. Fiddy ThB2-1 pp, 35–36.

Primary Examiner—Janice A. Howell
Assistant Examiner—Kiet T. Nguyen
Attorney, Agent, or Firm—Donald M. Boles

[57] ABSTRACT

A heterojunction optical switch is taught. Briefly stated, birefringence in the form of a Pockel Cell is utilized such that biasing of the Pockel Cell permits the passage of light therethrough. Preferably, a light detector and resistor are electrically in parallel with the Pockel Cell such that light impinging upon the light detector causes the Pockel Cell to be reverse biased with the result that a separate light source may pass through the Pockel Cell. In this fashion, the Pockel Cell operates as a true optical switch.

16 Claims, 3 Drawing Sheets

OPTO-PHOTO-ELECTRIC SWITCH

FIELD OF THE INVENTION

This invention relates, generally, to opto-electric switches and more particularly to an optical switch utilizing Pockels-cells electrically interconnected with a light detector such that impingement of light on the light detector provides a reverse bias to the Pockel Cell which in turn allows light impinging on the Pockels Cell to now pass therethrough.

BACKGROUND OF THE INVENTION

Optical communication is finding increased usage in information handling systems. However, one of the significant draw-backs for optical communication is the ability to gate or switch optical data directly. More particularly, it is frequently the case that optical information must be received, converted to electrical signals, operated upon, and the reconverted into an optical signal at each juncture, switch or logic point. This necessarily significantly reduces the advantages inherent in optical communication such as large bandwidth and speed.

An early attempt at logic switching may be found in U.S. Pat. No. 3,050,633, "Logic Network" issued Aug. 21, 1962 to Loedner. A significant disadvantage of this reference is that conversion from electrical to non-electrical signals is required at the actual point of switching. U.S. Pat. No. 3,145,302, "Electro-optical Circuitry Having Improved Response Speed" issued Aug. 18, 1964 to Dunne et al. and U.S. Pat. No. 3,157,792, "Exclusive-or Photo Responsive Logical Circuits" issued Nov. 17, 1964 to Low et al. are similar to Loedner in that they require the transition of electrical to optical energies in order to accomplish their task and as a result suffer from the same disadvantages. U.S. Pat. No. 3,348,064, "Flexible Logic Circuit Utilizing Field Effect Transistors and Light Responsive Devices" issued Oct. 17, 1967 to Powlus also suffers from similar disadvantages in that logic is performed in the electrical rather than the optical domain.

U.S. Pat. No. 3,470,491, "Bistable Laser Apparatus" issued Sep. 30, 1969 to MacNeille attempts to switch optical information in the optical domain by the use of Kerr cells. However, Kerr cell switching does not lend itself to high speed integrated circuit usage while also requiring extraordinarily precise manufacturing techniques, and hence is not suitable for present-day technologies. U.S. Pat. No. 3,611,207, "Wide Aperture Electo-optic Modulator" issued Oct. 5, 1971 to Klahr discloses a semiconductor using the Pockels effect. However, this reference fails to teach or suggest switching in that it deals strictly with the modulation of light and not the switching of light.

U.S. Pat. No. 3,781,081, "Electro-optical Waveguide Arrangements" issued Dec. 25, 1973 to Rokos; U.S. Pat. No. 3,995,311, "Optical Logic Elements" issued Nov. 30, 1976 to Taylor; and U.S. Pat. No. 4,128,300, "Optical Logic Elements" issued Dec. 5, 1978 to Stotts et al. require that an external electrical field be applied through to the use of "electrodes." Accordingly, these required electrodes are extremely bulky and expensive to manufacture and do not readily lend themselves to VLSI manufacturing techniques. Another attempt at logic switching may be found in the U.S. Pat. No. 3,818,451, "Light-emitting and Light-receiving Logic Array" issued Jun. 18, 1974 to Coleman. However, this scheme also has disadvantages in that conversion from optical to electrical energies is necessitated on both ends of the device.

U.S. Pat. No. 4,053,763, "Method and Apparatus for Pulse Stacking" issued Oct. 11, 1977 to Harney utilizes a Pockels cell for effectively reconfiguring a light pulse. However, it still requires a multitude of external devices and optical switching elements and is hence unsatisfactory for VLSI manufacturing. U.S. Pat. No. 4,506,151, "Optoelectronic Logic" issued Mar. 19, 1985 to MacDonald et al. provides a complicated scheme utilizing photo-responsive gallium arsenide field effect transistors and accordingly utilizes an optical/electrical interface rather than simply switching the optical energy itself. U.S. Pat. No. 4,555,785, "Optical Repeater Integrated Lasers" issued Nov. 26, 1985 to Scifres et al. utilizes an integrated circuit device which accomplishes "optical switching" by receiving and producing light in the same structure. However, this again fails to merely pass on the actual optical energy received but rather "reconverts" the light. Similarly, U.S. Pat. No. 4,606,032, "A Stable Optical Multi-viborator" issued Aug. 12, 1986, also to Scifres et al. operates as a repeater and suffers from the same disadvantages as Scifres '785.

U.S. Pat. No. 4,675,518, "Optical Bistable Device" issued Jan. 23, 1987 to Oimura et al. although operating as an optical switch is similar to Scifres et al. '785 in that the actual light received is not the optical energy that is switched but rather electrically reconfigured. U.S. Pat. No. 4,689,793, "Optical Logic and Memory Apparatus" issued Aug. 25, 1987 to Liu et al. utilizes direct polarization switching and hence optically reroutes the light received and requires the optical energy to change polarization rather than be gated or switched. U.S. Pat. No. 4,782,223, "Optically Bistable Photodiode Device with Voltage Control Circuitry to Change Photodiode Light Absorption" issued Nov. 1, 1988 to Suzuki is an optical switch which does not take advantage of Pockel cells but rather uses a photodiode. U.S. Pat. No. 4,802,175, "Opto-electric Logic Elements" issued Jan. 31, 1989 to Suzuki discloses a device which accomplishes optical switching by having differential gain characteristics with respect to the quantity of input light thereof in relation to the value of an injection current. Therefore, the light received is not actually switched.

Accordingly, while all of the above schemes attempt to "switch" light, they are all either complex or require the switched opto-energy to be effectively converted to electrical energy at one point or another.

It is therefore an object of the present invention to produce an optical switch which does not require that the light switched be converted from optical to electrical energy. It is yet another object of the present invention to produce a device which is readily integratable into small and large scale integration devices. It is yet another object of the present invention to produce an optical switch which has a wide bandwidth and is extremely fast in its capacity to switch light.

Yet another object of the present invention is to produce a device which is controllable without the use of significant external circuitry. Still another object of the present invention is to produce a device which is extremely compact.

Another object of the present invention is to produce a optical switch which does not substantially diminish the optical energy of the switched light. Still a further object of the present invention is to produce an optical switch which may be controlled by an additional light source.

Yet another object of the present invention is to produce an optical switch which utilizes the speed of gallium arsenide technology. Still a further object of the present invention is to produce an optical switch which is readily usable with a plurality of logic functions, i.e. inverters, AND, OR, and similar type of logic devices.

A still further object of the present invention is to produce an optical switch comprising a Pockel Cell and a light detector electrically interconnected to the Pockel Cell whereby light energy impinging on the light detector reverse biases the Pockel Cell producing birefringence so as to permit the passage of optical energy through the Pockel Cell.

BRIEF DESCRIPTION OF THE DRAWINGS

Reference may be now had to the referenced drawings in which.

DESCRIPTION OF THE PREFERRED EMBODIMENT

The theory of Pockel cells, has been discussed in scholarly words and may be found in, for example, "Quantum Electronics," "Third Edition," written by Amnon Yariv and published by Wiley which describes this effect at section 14.0, page 298 (and thereafter) the substance of which is specifically incorporated by reference herein. Pockel cells are devices which exploit the phenomenon of birefringence. A birefringence substance is one that has two different indices of refraction. In Pockel cells, these indices of a fraction are at right angles with respect to each other. The effect of birefringence is to change the polarization of the light's electric field vector as the light propagates through the material. The thickness of the birefringence material determines the indice of refraction. Accordingly, if the thickness of the birefringence material is $\lambda/2$ then the electric field vector is rotated 90°. In Pockel cells, birefringence is only experienced if an electric potential difference is applied across it. This electric field in essence, aligns the dipole moment in the Pockels cell. Accordingly, when there is an absence of electrical potential across the Pockel Cell, the material is not birefringent and light will not pass through it.

Figure 1:
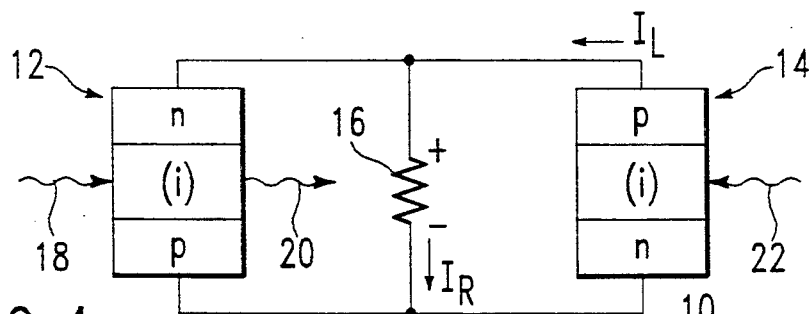
FIG. 1 is a schematic diagram of the basic light switch of the present invention.

Referring now to FIG. 1 there is shown a schematic representation of the basic optical switch of the present invention, shown generally at 10. The switch 10 is comprised of a Pockels cell 12 in parallel with a optophoto/opto-electric sensor, referred to hereafter as a light detector 14. A resistor 16 is provided in parallel with the Pockels cell 12 and light detector 14 and is used to insure that light is only switched when appropriate switching levels are obtained as described more fully below. The Pockels cell 12 and light detector 14 are formed by two PN junction structures (although PIN structures can and may also be used) and in the preferred embodiment of the present invention are manufactured using gallium arsenide (GaAs) as described more fully below. During operation, trigger light 22 is presented to light detector 14 with the result that a voltage is produced, referred to as a bias voltage. The result is that electrons will, of course, flow through resistor 16 providing a voltage thereacross. Light detector 14 is configured so that during this electron flow, a reverse bias condition is produced across Pockels cell 12. When this reverse bias is present across Pockels cell 12, input light 18 is permitted to pass through Pockels cell 12 and thereby exits as switched light 20. In this fashion, input light 18 can only pass through Pockels cell 12 when trigger light 22 is incident upon light detector 14. As soon as trigger light 22 is removed, the reverse bias condition across Pockels cell 12 no longer exists with the result that switch input light 18 cannot pass therethrough. Accordingly, it has been found that a very simple light switching condition is produced. This invention utilizes the elegance of Pockel Cell electro-optic effects in conjunction with a photocell or photodiode.

Accordingly, it can be seen that the entire purpose of light detector 14, serving as a signal, is to apply an electric field to Pockel Cell 12. In this regard, it is possible that in some circumstances an associated circuitry (not shown) could be utilized in lieu of photo-detector 14 for the purpose of applying an electric field to the Pockel Cell 12 without departing from spirit and scope of the present invention. Additionally, since the trigger light 22 is disassociated from the switched light 20, the two sources of light 18, 22 are completely independent. The gain arrangement between the two is therefore totally independent and in this regard can be completely arbitrary. This enables it utilization in a variety of areas such as, for example, clamping/crowbar circuits or avalanche type devices.

In the preferred embodiment of the present invention the Pockel Cell 12 is made of heterojunction materials which are preferably gallium arsenide (GaAs) or gallium phosphide (GaP), or lithium niobate oxide (LiNbO$_3$) or lithium tantalum oxide (LiTaO$_3$) to name a few. Further, light detector 14 may be, as previously mentioned, associated circuitry or may be a photodiode, a photodetector, a photoconductor, a phototransistor, or similar device without departing from the spirit and scope of the present invention. Equations describing the current flow through the device shown in FIG. 1 are:

$$I_R = I_S \left( e^{\frac{qV}{kT}} - 1 \right) - I_L \qquad \text{Eq. 1}$$

$$I_L = q \left( \eta \frac{P_{op}}{h\nu} \right) \qquad \text{Eq. 2}$$

where:
$I_R$ = the current through resistor 16;
$I_S$ is equal to the saturation current of light detector 14;
q is the electron charge;
V is equal to the voltage;
k is Boltzmann constant;
T is absolute temperature;

$I_L$ is equal to the current produced by the light detector 14;

η is the efficiency of generating electron whole pairs, referred to as the quantum efficiency;

Pop is equal to incoming optical power;

h is plancks constant; and

ν is the frequency of incident optical radiation.

Figure 2:
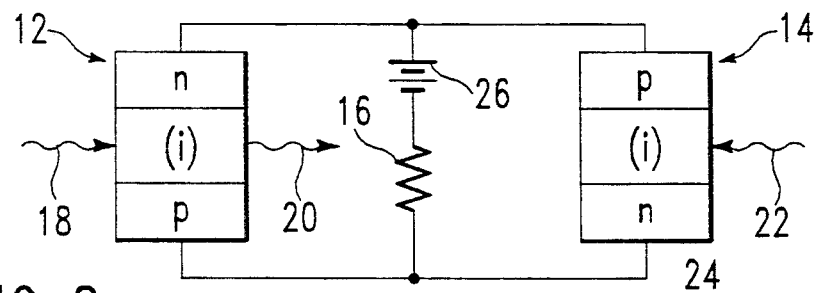
FIG. 2 is a schematic diagram of the optical switch of the present invention operating in an inverter mode.

Referring now to FIG. 2, there is shown the optical switch of the present invention utilized as an inverter and is shown generally at 24. It can be seen that operation of the inverter 24 is substantially identical to that of switch 10 of FIG. 1 with the exception of power supply 26. The purpose of power supply 26 is to maintain a reverse bias, and hence an "on" condition, for the Pockel Cell. Accordingly, light will normally pass through the Pockel Cell since an electrical potential exists across it. However, when input light 18 shines onto light detector 14, the Pockel Cell 12 will longer be reverse biased with the result that light will not be transmitted through the Pockel Cell 12. It is to be understood that reverse biasing may also be accomplished in a variety of other ways such as, for example, use of a second light detector having its polarity in reverse with respect to light detector 14. In this manner, inverter gating may be accomplished.

Figure 3:
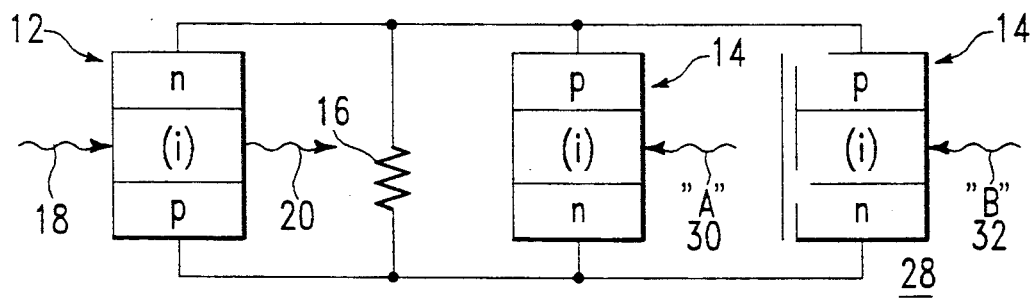
FIG. 3 is a schematic representation of an optical switch of the present invention functioning as an AND circuit.

Referring now to FIG. 3 there is shown the optical switch of the present invention utilized as an AND gate 28. It can be readily seen that gate 28 is substantially similar to the optical switch of FIG. 1 with the exception that two light detectors 14 are utilized. Each of the light detectors are fabricated to supply only one-half of the current required to provide sufficient drop across resistor 16 in order to properly reverse bias the Pockel Cell 12. Accordingly, logic input light "A" 30 and logic input light "B" 32 must both be present, (the "AND" configuration), in order for Pockel Cell 12 to be properly and fully biased such that input light 18 will exit as switch light 20 therefrom. Alternately, it is to be understood that the value of resistor 16 may be adjusted such that when only one light (such as "A") is incident upon a light detector 14, the voltage drop across resistor 16 and hence the bias condition will properly be insufficient to bias the Pockel Cell 12. Thereafter, as long as the "A" light remains present, and light "B" is introduced, the current through resistor 16 will increase sufficiently whereby the voltage drop across resistor 16 will produce the proper biasing voltage across Pockels cell 12 which will then permit light to pass therethrough. Another variation may be simply to use a single detector 14, manufactured such that the sum total of all the optical energy from all the logical AND inputs must impinge upon detector 14 before the required electrical current $I_L$ is produced.

Figure 4:
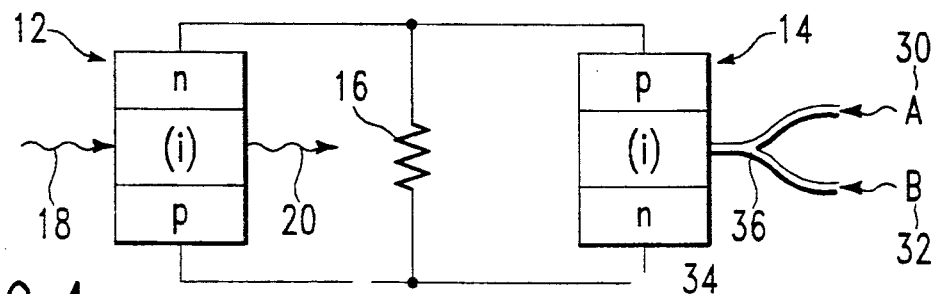
FIG. 4 is a schematic representation of the optical switch of the present invention operating as an OR device.

Referring now to FIG. 4 an optical switch operating as an OR gate is shown generally at 34. It can again be seen that the operation of the OR gate 34 is substantially similar to the optical switch of FIG. 1 with the addition of a "fan-in" waveguide 36. This waveguide 36 permits logic input light "A" shown at 30 and logic input light "B" shown at 32 to be transmitted through and thereby impinge upon light detector 14. In this fashion, input light "A OR B" 30, 32 will permit or prohibit the transmission of light through the Pockel Cell 12 in a fashion substantially identical to that mentioned with respect to FIG. 1.

Figure 5:
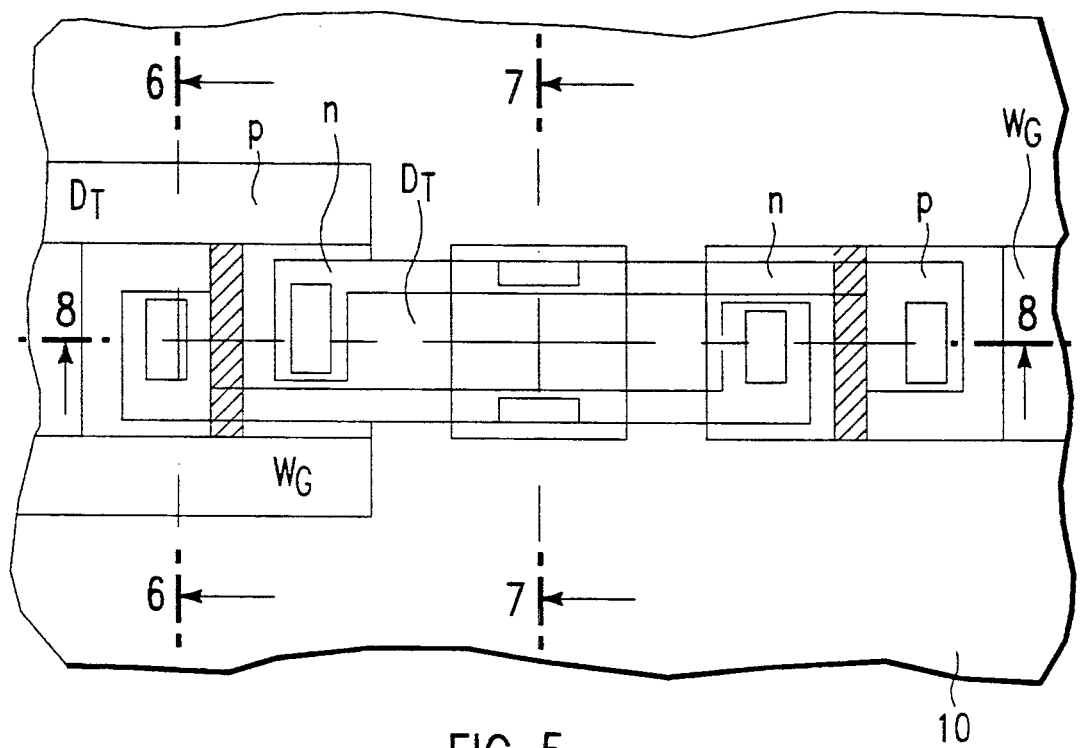
FIG. 5 is a view of the horizontal geometry of the optical switch construction of the present invention.
Figure 6:
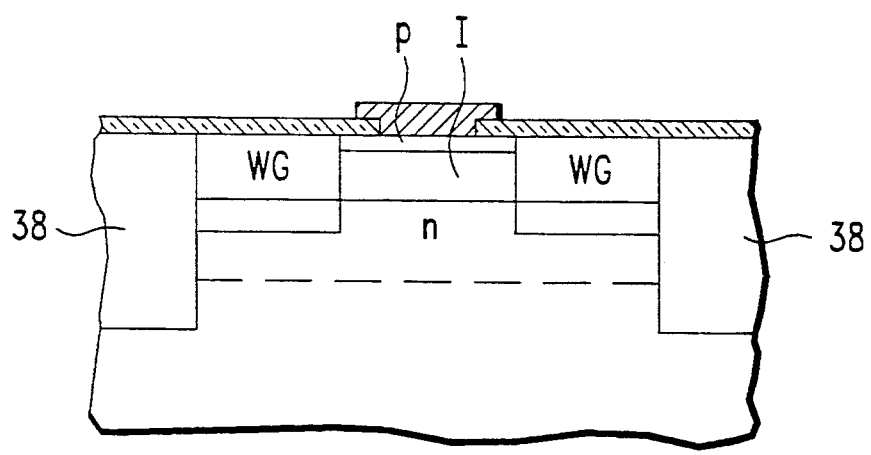
FIGS. 6, 7, and 8 are cross-sectional views taken through the horizontal view of FIG. 5.
Figure 7:
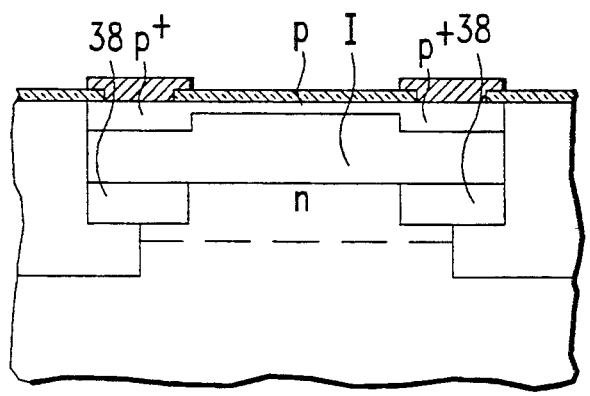
Figure 8:
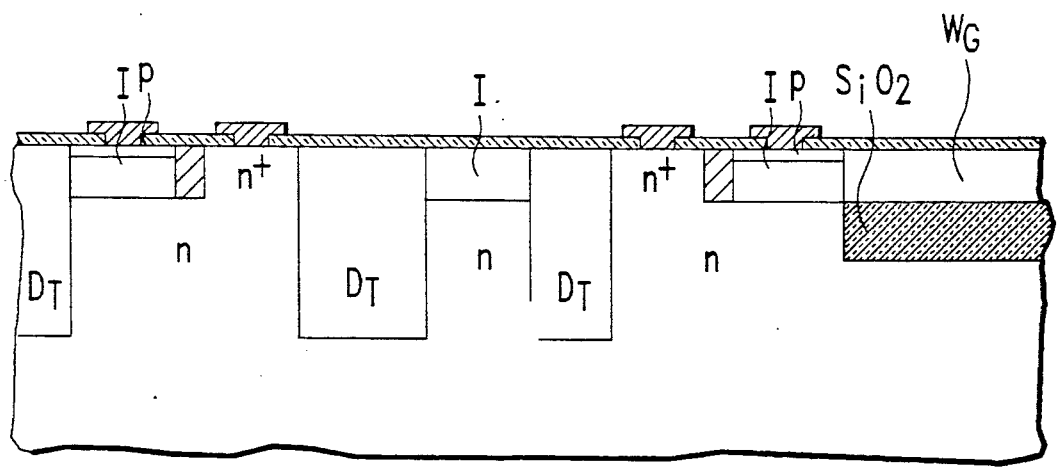

Referring now to FIG. 5 there is shown a plane view of the overall horizontal geometry of the switch 10 as shown in FIG. 1. In the preferred embodiment of the present invention GaAs is used. FIGS. 6, 7, and 8 are cross-sectional views taken through associated portions of the horizontal geometry of FIG. 5. Here the orientation with respect to various portions of the switch 10 can be seen such as the deep trench DT, the waveguide WG portion. In the preferred embodiment of the present invention the waveguide material is preferably silicon dioxide $SiO_2$. Also shown is the dopant materials N+ and P+ and P. However, it is to be understood that other types of insulators can and may be utilized without departing from the spirit and scope of the present invention. Further, these devices may be produced without the use of intrinsic material I without departing from the spirit and scope of the present invention.

It is to be understood that many variations of the present invention may practiced without departing from the spirit and scope of the present invention. For example, other types of device manufacturing geometries may be utilized without departing from the spirit and scope of the present invention. Further, there are several types of logic gates such as, exclusive OR, NOR and the like which may be practiced without departing from the spirit and scope of the present invention. Also, the waveguide arrangement could be altered or eliminated. Accordingly, the scope of the present invention is not to be limited by the preferred embodiment but rather by the claims appended hereto.

What is claimed is:

1. An optical switch, comprising:
   a Pockel Cell disposed on a semiconductor substrate for permitting the passage of a first light there through in response to an electrical potential applied thereto; and
   first biasing means disposed on said semicondutor substrate for applying said electrical potential to said Pockel Cell.

2. The device according to claim 1 wherein said first biasing means is comprised of a light detector for producing said electrical potential in response to the impingement of a second light in the form of optical energy on said light detector.

3. A device according to claim 1 wherein said first biasing means is comprised of one or more devices from the group consisting of: photodiodes, photocells, and phototransistors.

4. A device according to claim 2 wherein said first biasing means is comprised of one or more light detectors from the group consisting of: photodiodes, photocells, and phototransistors.

5. The device according to claim 1 wherein said first biasing means is comprised of a power supply.

6. The device according to claim 2 further comprising an impedance means in parallel circuit relationship with said first biasing means.

7. The device according to claim 6 wherein said impedance means is comprised of a resistor.

8. The device according to claim 2 wherein said first biasing means is comprised of at least two light detectors, configured such that said optical energy must impinge upon each of said at least two light detectors, thereby forming a logical AND gate.

9. The device according to claim 2 wherein said light detector is adapted to receive at least two sources of optical energy thereon, such that said light detector produces said electrical potential upon the impingement of optical energy on at least one of said at least two sources of optical energy, thereby forming a logical OR gate.

10. A device according to claim 2 further comprising a second biasing means, said second biasing means operatively connected to said Pockel Cell so as to provide an electrical potential to said Pockel Cell in reverse polarity with respect to said first biasing means and for permitting said passage of said first light through said Pockel Cell, whereby upon said impingement of said optical energy on said light detector, said electrical potential to said Pockel Cell is reduced thereby prohibiting the passage of said first light through said Pockel Cell, thereby form a logical INVERTER gate.

11. A device according to claim 10 wherein said second biasing means is comprised of a voltage source.

12. A device according to claim 10 wherein said second biasing means is comprised of a light detector.

13. A device according to claim 8 further comprising a second biasing means, said second biasing means operatively connected to said Pockel Cell so as to provide an electrical potential to said Pockel Cell in reverse polarity with respect to said first biasing means and for permitting said passage of said first light through said Pockel Cell, whereby upon said impingement of said optical energy on said light detector, said electrical potential to said Pockel Cell is reduced thereby prohibiting the passage of said first light through said Pockel Cell, thereby form a logical NAND gate.

14. A device according to claim 9 further comprising a second biasing means, said second biasing means operatively connected to said Pockel Cell so as to provide an electrical potential to said Pockel Cell in reverse polarity with respect to said first biasing means and for permitting said passage of said first light through said Pockel Cell, whereby upon said impingement of said optical energy on said light detector, said electrical potential to said Pockel Cell is reduced thereby prohibiting the passage of said first light through said Pockel Cell, thereby form a logical NOR gate.

15. A device according to claim 13 wherein said second biasing means is comprised of a light detector.

16. A device according to claim 14 wherein said second biasing means is comprised of a light detector.

* * * * *